United States Patent
Ochoa

(10) Patent No.: US 6,560,733 B1
(45) Date of Patent: May 6, 2003

(54) SOFT ERROR DETECTION FOR DIGITAL SIGNAL PROCESSORS

(75) Inventor: Roland Ochoa, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/350,316

(22) Filed: Jul. 9, 1999

(51) Int. Cl.⁷ .............................................. G11C 29/00
(52) U.S. Cl. ..................................................... 714/723
(58) Field of Search ................................. 714/718, 719, 714/720, 723, FOR 290, 735, 736, 25, 40, 42, 20; 365/201

(56) References Cited

U.S. PATENT DOCUMENTS

| | | | |
|---|---|---|---|
| 3,633,175 A | | 1/1972 | Harper |
| 4,426,688 A | | 1/1984 | Moxley |
| 4,608,687 A | | 8/1986 | Dutton |
| 4,964,130 A | * | 10/1990 | Bowden, III et al. ...... 371/40.2 |
| 5,199,033 A | | 3/1993 | McGeoch et al. |
| 5,233,614 A | * | 8/1993 | Singh ......................... 371/21.6 |
| 5,357,473 A | * | 10/1994 | Mizuno et al. ............. 365/201 |
| 5,588,046 A | * | 12/1996 | Knuth et al. ................... 379/67 |
| 5,659,678 A | | 8/1997 | Aichelmann, Jr. et al. |
| 5,758,056 A | | 5/1998 | Barr |
| 5,862,314 A | * | 1/1999 | Jeddeloh ......................... 714/8 |
| 5,966,725 A | * | 10/1999 | Tabo ........................... 711/106 |
| 5,996,106 A | * | 11/1999 | Seyyedy ...................... 714/763 |
| 6,256,756 B1 | * | 7/2001 | Faulk, Jr. ..................... 714/718 |
| 6,279,128 B1 | * | 8/2001 | Arnold et al. ................. 714/49 |
| 6,292,869 B1 | * | 9/2001 | Gerchman et al. .......... 711/106 |

* cited by examiner

Primary Examiner—Albert Decady
Assistant Examiner—Matthew C. Dooley
(74) Attorney, Agent, or Firm—Trop, Pruner&Hu, P.C.

(57) ABSTRACT

The invention provides an initialization routine for digital signal processors that detects and maps out soft errors. A digital signal processing system may include an initialization routine stored in a non-volatile memory device that writes a bit pattern to the memory arrays. The routine may then cause the processor to perform refresh cycles to refresh the charge of each bit in the arrays. Next, the initialization routine may read data values from the memory arrays and compare them with the previously written bit pattern. If a value does not match the bit pattern, then the bit may have failed due to a soft error. An indication of the failed bit may then be stored in the first few rows of the memory array, thereby mapping out the failed location.

27 Claims, 2 Drawing Sheets

SOFT ERROR DETECTION FOR DIGITAL SIGNAL PROCESSORS

BACKGROUND

The invention relates generally to digital signal processors and, more particularly, to initialization routines for digital signal processors.

Digital signal processing has become an important technology in the information age. Digital signal processors are utilized in several areas of technology including telecommunications, computers, and telephone answering machines. Generally, digital signal processors may provide digital filtering capabilities that surpass those of analog devices. Conventional digital signal processors include a processing unit, multiple buses, and multiple memory arrays to store data and instructions. Digital signal processors may also include routines to initialize the processor and memory arrays. The initialization routine may be invoked whenever the digital signal processor is powered on or reset. An initialization routine for a digital signal processor may identify errors in the memory arrays due to hardware failures. The initialization routine then stores indications of the failed memory cells in a specified location of the memory array to mark them as bad cells. Once identified, bad memory cells may be avoided during normal operations.

Conventional initialization routines generally do not allow for detection of soft errors in the memory arrays. Soft errors are temporary errors that occur when a bit in a memory array is flipped from a 1 to a 0 or vice versa. For example, soft errors may be due to alpha particles, cosmic rays, or other charged particles. Soft errors may also be caused by defects in manufacturing such as gaps in a cell nitrate layer of a memory cell, also called pinholes, which may reduce the amount of charge that the cell may hold. Additionally, soft errors may be caused by leakage between a memory cell and an adjacent cell, which, over time, may reduce the amount of charge of the memory cell. Soft errors may lead to a loss of data integrity or even memory failure if not detected. Because soft errors are temporary, the affected memory cells need only be marked as failed until the digital signal processor is reset.

When manufacturers of memory array devices perform integration tests with digital signal processors, the detection of hardware errors in the memory arrays is crucial. If a memory array device includes more than a specified number of failed memory cells, the device fails to pass inspection and may not be sold. Because conventional initialization routines do not specifically detect soft errors, any error that is detected is presumed to be due to a hardware failure. Therefore, many memory array devices may fail to pass inspection only because of the presence of temporary soft errors during the integration tests. If an excessive number or memory cells are detected as failed, manufacturers may perform additional tasks to determine whether at least some of the detected errors are soft errors. Such additional testing is time consuming and may increase the cost of electronic systems using digital signal processors.

Thus, it would be beneficial to provide an initialization routine for digital signal processors which detects soft errors.

SUMMARY

In one embodiment, the invention includes an initialization routine for a digital signal processing system that writes a bit pattern to a memory array. The initialization routine may also include the act of reading from the memory array and identifying an error when the value read from a memory cell is different from the value written to a memory cell. Soft errors may be mapped out by storing indications of the failed memory cells at a specified location in the memory array. In another embodiment, the invention provides a digital signal processing system including a memory array coupled to a digital signal processor (DSP) adapted to determine and map out DSP memory array soft errors. The digital signal processing system may also include an initialization routine for detecting and mapping out soft errors. In yet another embodiment, the invention provides a computer system including a processor, a digital signal processor, and a memory array. This embodiment of the invention may also include an initialization routine for the digital signal processor to detect soft errors.

DETAILED DESCRIPTION

Figure 1:
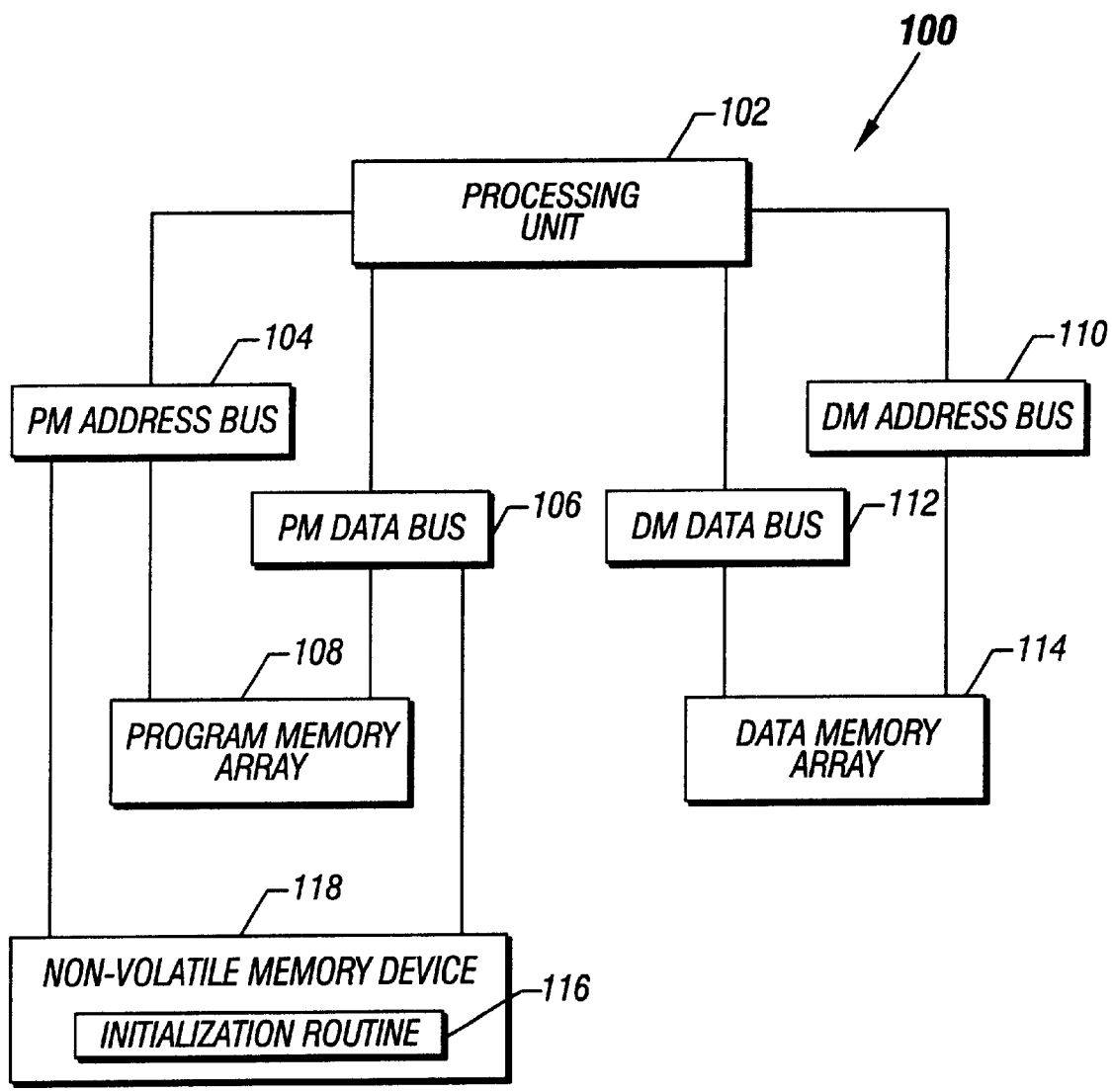
FIG. 1 shows an illustrative digital signal processing system having an initialization routine.

Referring to FIG. 1, an illustrative digital signal processing system 100 in accordance with one embodiment of the invention may include a processing unit 102 and multiple memory arrays such as a program memory array 108 and a data memory array 114. The memory arrays 108 and 114 include several memory cells or bits arranged in rows and columns to form an array. The bits in each row in the memory arrays 108 and 114 may be grouped into blocks of sequential bits. An example of a conventional memory array is the Micron S414000-TI audio dynamic random access memory (audio DRAM), which may be coupled with a digital signal processor and incorporated in digital answering machines.

A processing unit 102 may access the memory arrays 108 and 114 through a series of buses to enable the processing unit 102 to retrieve several data items in a single clock cycle. The processing unit 102 may be coupled to a program memory address bus (PM address bus) 104 and a program memory data bus (PM data bus) 106. The PM address bus 104 may allow the transfer of program instruction addresses from the program memory array 108 to the processing unit 102. Likewise, a program memory data bus (PM data bus) 106 may allow the transfer of program instructions from the program memory array 108 to the processing unit 102. A processing unit 102 may also be coupled to a data memory address bus (DM address bus) 110 and a data memory data bus (DM data bus) 112. The DM address bus 110 may allow the transfer of data addresses from the program memory array 108 to the processing unit 102. Likewise, a data memory data bus (DM data bus) 112 may allow the transfer of data words from the data memory array 114 to the processing unit 102.

In accordance with one embodiment of the invention, an initialization routine 116 for the digital signal processing system 100 may be located in a non-volatile memory device 118. Conventional non-volatile memory devices include electrically programmable read only memory (EPROM), electrically erasable programmable read only memory (EEPROM), and flash memory devices. The processing unit 102 may retrieve instructions of the initialization routine 116 from the program memory array 108 via the PM address bus 104 and the PM data bus 106. The initialization routine 116 may cause the processing unit 102 to initialize the memory arrays 108 and 114 by writing a bit pattern to the arrays. Subsequently, the initialization routine 116 may cause the processing unit 102 to read bit values from the memory arrays 108 and 114 and compare the values to the previously written bit pattern to determine the locations of failed memory cells. The initialization routine 116 enables the digital signal processing system 100 to test for soft errors any time the system is reset.

Figure 2:
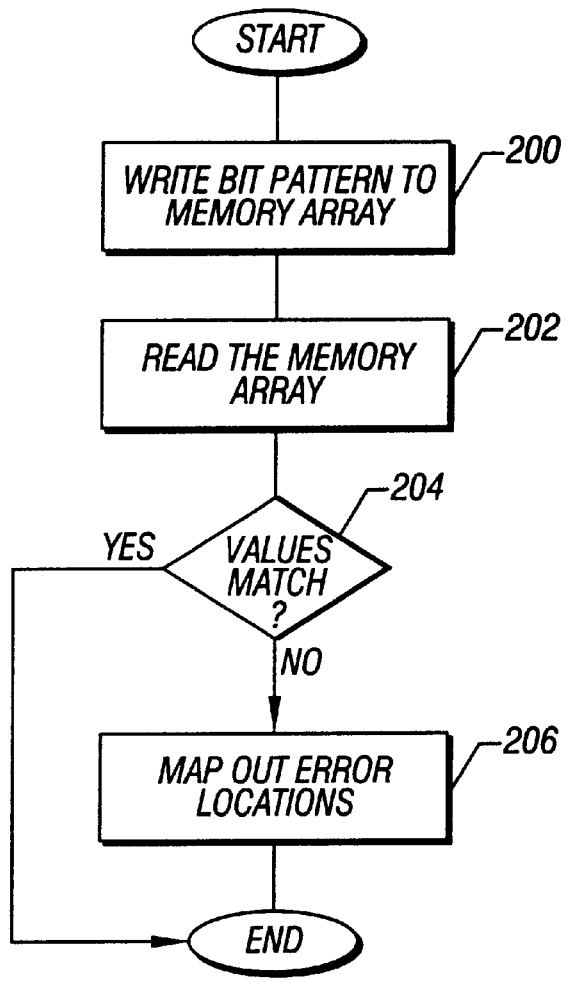
FIG. 2 shows a flow diagram for an initialization routine that detects soft errors in accordance with one embodiment of the invention.

Referring to FIG. 2, in accordance with one embodiment of the invention, the initialization routine 116 may cause the processing unit 102 to write a bit pattern to the memory arrays 108 and 114 at block 200. The bit pattern may include all ones or all zeros. In another embodiment, the bit pattern may include row stripes of ones and zeroes. In a row stripe pattern, rows of a memory array may be alternately filled with all ones or all zeroes, such that one row may include all ones and the next row may include all zeroes. Additionally, the bit pattern may include column stripes of ones and zeroes. In a column stripe pattern, columns of a memory array may alternately be filled with all ones or all zeroes, such that one column may include all ones and the next column may include all zeroes. In yet another embodiment, the bit pattern may include a checkerboard pattern of ones and zeroes. In a checkerboard pattern, the bits of a row may alternate between ones and zeroes. Additionally, the rows of a checkerboard pattern may be staggered such that the first bit in a row may be a one and the first bit in both the previous and subsequent rows may be a zero. In yet another embodiment, the bit pattern written to the memory arrays 108 and 114 may be any combination of the previously mentioned bit patterns.

Subsequently, at block 202, the initialization routine 116 may cause the processing unit to read memory cell values from the memory arrays 108 and 114. At diamond 204, the initialization routine 116 may cause the processing unit 102 to compare the memory cell values read during the acts of block 202 with the bit pattern that was previously stored in the memory array during the acts of block 200. If the memory cell values do not match the values of the bit pattern, then a memory cell may have failed causing an error. At block 206, errors may be mapped out by storing indications of the failed memory cells at a specified location in the memory array. For example, the initialization routine 116 may store the memory address corresponding to a failed memory cell in a predetermined location. Conventional memory arrays may allocate certain locations in the array to be relied upon as error free storage for indications of memory cell failures. For example, in the Micron S414000-TI audio DRAM, the first eight (8) rows of the DRAM array are required to be error free. If a memory cell error is detected, then an indication of that error may be stored in one of the first eight (8) rows of the DRAM array, thereby marking the entire block which contains that bit as failed. The specifications for the Micron S414000-TI audio DRAM define a block as 240 sequential bits. Therefore, if one bit in the DRAM array fails, then the entire block of 240 bits may be marked as failed. The detection of soft errors in this manner is critical because the DRAM's specification states that an array may have no more than five (5) bad blocks per row.

In addition to varying the bit pattern, the initialization routine 116 may include refresh cycles for the memory arrays 108 and 114 between the read and write operations to further detect soft errors. The refresh cycles are intended to refresh the current values of bits in the memory array. During a refresh cycle, each bit of a single row in a memory array may be accessed. The value of a bit may be sensed based on a threshold level of charge necessary to distinguish between a one and a zero. Then, the refresh cycle may refresh the bit with the sensed value. Enough refresh cycles may occur to refresh all of the rows in the memory arrays 108 and 114. Conventional initialization routines generally do not recognize errors in bits that are sensitive to storage cell leakage conditions. The addition of refresh cycles to the initialization routine 116 may remedy this problem by refreshing each bit in the memory arrays 108 and 114.

In addition to providing the capability to test for memory failures any time the system is reset, the initialization routine 116 may also provide a method of testing the memory arrays 108 and 114 according to performance standards under operational conditions. The digital signal processing system 100 may effectively detect and map out soft errors by performing the initialization routine under the same constraints that the system employs when in operation. For example, variations in the bit pattern may be more representative of actual data patterns that the memory array may encounter in use. Also, the initialization routine 116 may detect electrical coupling between adjacent data pins and address pins of the memory arrays 108 and 114. Electrical coupling conditions may occur when the voltage representing a one or a zero that is applied to a data pin or address pin is affected by the voltage applied to an adjacent pin. In order to determine coupling conditions, alternate polarity data may be applied to both the data pins and address pins during an initialization sequence. For example, a one value may be applied to a first data pin and a zero value to the second data pin, etc. Then, data may be read from the memory arrays 108 and 114 and compared with the previously written data to determine if an error occurred. In one embodiment, an alternate polarity data word may be written to a memory location and then subsequently read. In another embodiment, alternate polarity data words may be written to an entire memory array, and then data may be read from each memory location to determine coupling conditions. Additionally, the initialization routine 116 may cause the processing unit 102 to perform a number of refresh cycles between the write and read operations. Another operational constraint which the initialization routine 116 may enforce is the speed of the memory array. The initialization routine 116 may verify that the write, refresh, and read operations are performed according to the specifications of the memory array. For example, the Micron S414000-TI audio DRAM is a Fast Page Mode (FPM) device. Therefore, the initialization routine 116 must meet the FPM timing standards.

Figure 3:
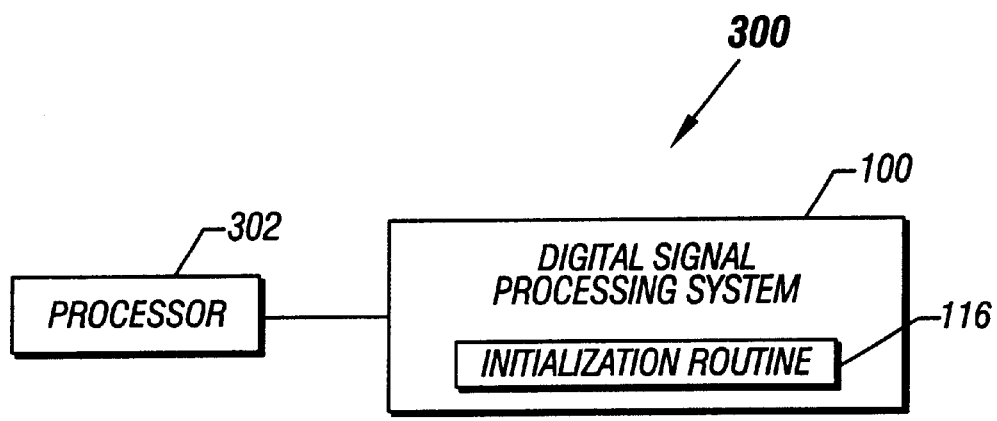
FIG. 3 shows a computer system having a digital signal processing system in accordance with another embodiment of the invention.

Referring to FIG. 3, an illustrative computer system 300 in accordance with one embodiment of the invention may include a processor 302 coupled to a digital signal processing system 100. The computer system 300 may utilize the digital signal processing system 100 for processing audio signals or other digital filtering functions. The processor 302 may interact with the digital signal processing system 100 to perform digital signal processing functions. The initialization routine 116 may also be used in this embodiment to detect and map out soft errors in the memory arrays 108 and 114.

Various changes in the materials, components, circuit elements, as well as in the details of the illustrated operational method are possible without departing from the scope of the claims. For instance, acts in accordance with FIG. 2 may be performed by a programmable control device executing instructions organized into a program module (e.g., initialization routine 116). A programmable control device may be a single computer processor (e.g., processor 302), a plurality of computer processors coupled by a communications link, a microcontroller, or a custom designed processing unit such as a digital signal processor (e.g, processing unit 102). Custom designed processors may be embodied in a hardware device such as a printed circuit board comprising discrete logic, integrated circuits, specially designed application specific integrated circuits (ASICs), or field programmable gate array devices. Storage devices suitable for tangibly embodying program instructions include all forms of non-volatile memory including, but not limited to: semiconductor memory devices such as EPROM, EEPROM, and flash devices; magnetic disks (fixed, floppy, and removable); other magnetic media such as tape; and optical media such as CD-ROM disks.

While the invention has been disclosed with respect to a limited number of embodiments, numerous modifications and variations will be appreciated by those skilled in the art. It is intended, therefore, that the following claims cover all such modifications and variations that may fall within the true sprit and scope of the invention.

What is claimed is:

1. A method to map out soft memory errors in a digital signal processing system memory array, the memory array having a plurality of memory cells, wherein each cell is adapted to store a value, comprising:

writing a first value to a memory cell;

reading a second value from the memory cell;

identifying the memory cell as failed when the second value is different from the first value; and mapping out the failed memory cell as having a soft memory error, wherein the act of mapping out the failed memory cell comprises storing an indication of the failed memory cell at a specified location of the memory array, and wherein the acts of writing, reading, identifying, and mapping are performed during at least one of initialization of the digital signal processing system and operation of the digital signal processing system.

2. The method of claim 1, wherein the act of mapping out soft memory errors in a digital signal processing system memory array is performed during a memory array refresh operation of the digital signal processing system.

3. The method of claim 1, wherein storing the indication comprises storing the indication at the specified location in a memory chip in which the failed memory cell is located.

4. The method of claim 1, wherein the memory array is in a memory chip having pins, the method further comprising detecting electrical coupling between adjacent pins.

5. The method of claim 4, further comprising applying alternating polarity data to the pins for detecting the electrical coupling.

6. The method of claim 1, wherein the memory array comprises a dynamic random access memory (DRAM) array, and wherein storing the indication comprises storing the indication in the specified location of the DRAM array.

7. A method to map out soft memory errors in a digital signal processing system memory array, the memory array having a plurality of memory cells, wherein each cell is adapted to store a value, comprising:

writing a first value to a memory cell;

reading a second value from the memory cell;

identifying the memory cell as failed when the second value is different from the first value;

mapping out the failed memory cell as having a soft memory error; and refreshing at least a portion of the memory array between the acts of writing the first value to the first memory cell and reading the second value from the first memory cell, wherein performing the refreshing enables the detection of the soft memory error.

8. The method of claim 7, wherein the act of writing a first value comprises writing a pattern to a plurality of memory cells.

9. The method of claim 8, wherein the act of writing a pattern to a plurality of memory cells, comprises writing a checkerboard pattern of one values and zero values to the plurality of memory cells.

10. The method of claim 8, wherein the act of writing a pattern to a plurality of memory cells, comprises writing a row stripe pattern of one values and zero values to the plurality of memory cells.

11. The method of claim 8, wherein the act of writing a pattern to a plurality of memory cells, comprises writing a column stripe pattern of one values and zero values to the plurality of memory cells.

12. The method of claim 7, wherein the act of mapping out soft memory errors in a digital signal processing system memory array is performed during an initialization operation of the digital signal processing system.

13. The method of claim 7, wherein the act of refreshing comprises refreshing the entire memory array within a specified time period.

14. The method of claim 7, wherein the acts of writing, reading and refreshing are subject to the performance standards of the memory array.

15. The method of claim 7, wherein the memory array is in a chip having pins, the method further comprising detecting electrical coupling between adjacent pins.

16. A digital signal processing system, comprising:

a digital signal processor;

a memory array coupled to the digital signal processor; and a routine to detect and map out soft errors in the memory array, the routine to write a predetermined pattern to the memory array, perform a refresh on at least a portion of the memory array after writing the predetermined pattern, and subsequent to the refresh, read the memory array to detect the soft errors, the routine to detect the soft errors by performing the refresh.

17. The digital signal processing system of claim 16, wherein the routine is executable to map out the soft errors by storing an indication of a failed memory cell at a specified location of the memory array.

18. The digital signal processing system of claim 16, wherein the routine is stored in a non-volatile memory device that is coupled to the digital signal processor.

19. The digital signal processing system of claim 16, wherein the routine is executable during regular system operation of the digital signal processing system.

20. The digital signal processing system of claim 16, wherein the routine comprises an initialization routine executable during an initialization sequence of the digital signal processing system.

21. The digital signal processing system of claim 16, comprising a memory chip containing the memory array, and wherein the routine is executable to detect electrical coupling between pins of the memory chip.

22. A computer system, comprising:

a computer processor;

a digital signal processor coupled to the computer processor;

a memory array coupled to the digital signal processor; and a routine for the digital signal processor to detect and map out soft errors, the routine executable to write a predetermined pattern to the memory array, perform a refresh of at least a portion of the memory array after writing the predetermined pattern, and subsequent to the refresh, read the memory array to detect the soft errors, the routine to detect the soft errors by performing the refresh.

23. The computer system of claim 22, wherein the routine is executable to map out the soft errors by storing an indication of a failed memory cell at a specified location of the memory array.

24. The computer system of claim 22, wherein the routine is stored in a non-volatile memory device that is coupled to the digital signal processor.

25. The computer system of claim 22, wherein the routine is executable during regular system operation of the computer system.

26. The computer system of claim 22, wherein the routine comprises an initialization routine executable during an initialization sequence of the computer system.

27. The computer system of claim 22, comprising a memory chip containing the memory array, wherein the routine is executable to detect electrical coupling between adjacent pins of the memory chip.

* * * * *